United States Patent
Hundt et al.

[19]

[11] Patent Number: 5,805,419
[45] Date of Patent: Sep. 8, 1998

[54] LOW-PROFILE SOCKETED PACKAGING SYSTEM WITH LAND-GRID ARRAY AND THERMALLY CONDUCTIVE SLUG

[75] Inventors: Michael J. Hundt, Double Oak; Anthony M. Chiu, Richardson, both of Tex.

[73] Assignee: STMicroelectronics, Inc., Carrollton, Tex.

[21] Appl. No.: 756,460

[22] Filed: Nov. 26, 1996

Related U.S. Application Data

[63] Continuation of Ser. No. 440,367, May 12, 1995, abandoned.

[51] Int. Cl.⁶ ..................................................... H05K 7/20
[52] U.S. Cl. ........................... 361/719; 248/510; 257/720; 361/707; 361/764; 439/68
[58] Field of Search ................... 248/505, 510; 174/16.3, 52.2, 52.4; 267/150, 160; 24/295, 455, 457, 458, 625; 165/80.3, 185; 257/706, 707, 713, 727, 718–720; 439/485, 487, 18, 86, 70–73; 361/761, 764, 785, 787, 704–707, 709, 712, 717–719, 722

[56] References Cited

U.S. PATENT DOCUMENTS

| | | | |
|---|---|---|---|
| 3,795,884 | 3/1974 | Kotaka | 361/787 |
| 3,951,495 | 4/1976 | Donaher et al. | 339/17 CF |
| 4,190,879 | 2/1980 | Tissot | 361/386 |
| 4,620,761 | 11/1986 | Smith et al. | 339/75 MP |
| 4,630,172 | 12/1986 | Stenerson | 361/386 |
| 4,688,151 | 8/1987 | Kraus | 361/405 |
| 5,012,386 | 4/1991 | McShane et al. | 361/386 |
| 5,120,678 | 6/1992 | Moore et al. | 437/183 |
| 5,157,480 | 10/1992 | McShane et al. | 357/74 |
| 5,202,288 | 4/1993 | Doering et al. | 437/209 |
| 5,216,278 | 6/1993 | Lin et al. | 257/688 |
| 5,280,409 | 1/1994 | Selma | 361/720 |
| 5,282,111 | 1/1994 | Hopfer | 361/704 |
| 5,285,352 | 2/1994 | Pastore et al. | 361/707 |
| 5,291,062 | 3/1994 | Higgins, III | 357/702 |
| 5,298,686 | 3/1994 | Bourdelaise | 174/254 |
| 5,309,324 | 5/1994 | Hernandez | 361/734 |
| 5,403,776 | 4/1995 | Tsuji et al. | 437/183 |
| 5,455,456 | 10/1995 | Newman | 357/779 |
| 5,557,504 | 9/1996 | Siegal et al. | 361/173 |
| 5,570,273 | 10/1996 | Siegal et al. | 361/773 |

FOREIGN PATENT DOCUMENTS

| | | |
|---|---|---|
| 2609841 | 7/1988 | France . |
| 62-163351 | 7/1987 | Japan . |
| 63-081837 | 4/1988 | Japan . |
| 2-58358 | 2/1990 | Japan . |
| 8-203644 | 8/1996 | Japan . |
| 8-271578 | 10/1996 | Japan . |

*Primary Examiner*—Gerald P. Tolin
*Attorney, Agent, or Firm*—David V. Carlson; Theodore E. Galanthay; Lisa K. Jorgenson

[57] ABSTRACT

A socketed integrated circuit packaging system, including a packaged integrated circuit and a socket therefor, is disclosed. The integrated circuit package includes a device circuit board to which a thermally conductive slug is mounted; the underside of the device circuit board has a plurality of lands arranged in an array. The integrated circuit chip is mounted to the slug, through a hole in the device circuit board, and is wire-bonded to the device circuit board and thus to the lands on the underside. The socket is a molded frame, having a hole therethrough to receive the conductive slug of the integrated circuit package; the socket may also have its own thermally conductive slug disposed within the hole of the frame. The socket has spring contact members at locations matching the location of the lands on the device circuit board. The integrated circuit package may be inserted into the socket frame, held there by a metal or molded clip. A low profile, low cost, and high thermal conductivity package and socket combination, is thus produced.

31 Claims, 5 Drawing Sheets

LOW-PROFILE SOCKETED PACKAGING SYSTEM WITH LAND-GRID ARRAY AND THERMALLY CONDUCTIVE SLUG

CROSS-REFERENCE TO RELATED APPLICATION

This application is a file wrapper continuation of U.S. patent application Ser. No. 08/440,367, filed May 12, 1995, now abandoned.

This invention is in the field of integrated circuits, and is more particularly directed to packages therefor.

BACKGROUND OF THE INVENTION

Modern microprocessor-based data processing systems, particularly personal computers and computer workstations, are commonly upgradable in performance and capability. Typically, this upgrading is performed by replacing the originally installed microprocessor that serves as the central processing unit with a higher performance or more capable microprocessor. For example, one may upgrade a 386-based personal computer by removing the originally installed 386-type microprocessor and inserting, in its place, a 486-type microprocessor; by way of further example, one may upgrade the central processing unit by replacing the originally installed microprocessor with a microprocessor of the same type (e.g., 486-type) that can operate at a faster clock rate. Of course, other simple and minor adjustments of certain settings in the computer may also need to be made to accommodate the upgraded central processing unit.

Therefore, in the manufacture of upgradable personal computers, certain integrated circuits (e.g., at least the microprocessor) are installed into the system circuit board by way of sockets, rather than by being soldered directly to the circuit board, to facilitate removal and reinstallation of these components. Conventional sockets include sockets of the type that apply a mechanical force to pins of the integrated circuits so as to make contact thereto. However, as the number of terminals for microprocessors increase to more than 150 terminals, the total friction encountered in removing the microprocessor from such sockets becomes substantial, and may require a removal force of such magnitude as to crack or otherwise damage the board. While zero-insertion force sockets are also well known in the art, these sockets are generally quite expensive.

In addition, it is of course desirable to manufacture circuit boards with low-profile components, so that the overall height of the circuit board and its components is relatively low. This allows for the size of the overall system to be quite small, which is especially important for portable personal computers, such as those of the popular notebook size. However, conventional sockets, such as those described above, significantly raise the height of the circuit board and its components. The system designer and user are thus faced with the choice between reduced system size and upgradability in these circumstances.

By way of further background, ball-grid array (BGA) packages have become popular in the art, particularly for packaging microprocessors. As is well known, the terminals of a BGA package are solder balls, formed on the underside of the package and attached to plated lands thereat. A solder reflow process is then used to attach the BGA component to a circuit board after its placement thereat; the heat of the reflow process melts the solder balls so that they will wet to lands on the circuit board, thus electrically and mechanically connecting the component thereto. The solder reflow process is especially useful as it can be done at relatively low temperatures, and the ability to surface-mount the EGA packaged component eliminates the requirement of plated-through holes in the system circuit board. In addition, EGA packages allow a large number of terminals to occupy a small board area, as the pitch of solder balls on the package can be quite small (e.g., on the order of 0.1 cm). The BGA package is also a very low profile package, and is thus especially suitable for small systems such as notebook-size personal computers and the like.

However, according to the current state of the art, the benefits of BGA packages are not available if the component is to be installed by way of a socket. Firstly, the low profile provided by the BGA package is lost, for the most part, when the height of the socket is to be added to the system. Secondly, the solder balls tend to provide poor performance as a mechanical connection (i.e., when not reflowed to provide a solder connection). This is because conventional solder compositions tend to migrate, or creep, under mechanical force. In addition, the mechanical force required to make electrical contact to a cold solder ball is quite high (e.g., on the order of one ounce), exacerbating the problem of solder creep under mechanical stress. This high contact force is required in order to overcome the native oxide that rapidly forms over the surface of conventional solder balls. Despite these barriers, sockets for making removable connection to solder balls on a BGA package are known in the art, as will now be described relative to certain examples.

FIG. 1a and 1b illustrate a first example of a conventional socket for BGA components, such as is available from Methode Electronics, Inc. In this example, referring to FIG. 1a, BGA package 2 is converted into a pin-grid-array package (PGA), by reflow soldering of the BGA package 2 to pin board 4. As shown in the cross-section of FIG. 1b, pin board 4 solder connects each solder ball 3 of BGA package 2 to a corresponding pin 5 extending through pin board 4. The combination of BGA package 2 and pin board 4, so assembled, acts as a PGA package, and may now be inserted into conventional socket 6 that is soldered to the surface of system circuit board 8. As shown in detail in FIG. 1b, each of pins 5 of pin board 4 extend into and are received by pin sockets 7 in socket 6. Pin sockets 7 are each soldered to system circuit board 8, by way of solder joints 9 as shown in FIG. 1b. However, as is evident from FIG. 1b, the presence of both socket 6 and pin board 4, along with the height of reflowed solder balls 3, result in a relatively high profile combination package system. Furthermore, the cost of this package system can be quite high, considering that two additional piece parts (pin board 4 and socket 6) are required.

Referring now to FIGS. 2a and 2b, another example of a conventional socketing arrangement for a BGA package, manufactured and sold by AMP, will now be described for purposes of further background. As shown in FIG. 2b in cross-section, BGA package 12 has solder balls 13 connected thereto, extending from the bottom surface thereof. Solder balls 13 are received by receptacles 16 in socket 14, which in turn is soldered to system circuit board 18 by way of solder joints 19. Referring to the plan view of FIG. 2b, receptacles 16 are, in this example, configured as partially split rings, so that burrs 17 are present on the inner diameter of receptacles 16. Burrs 17 serve to cut into solder balls 13 when BGA package 12 is installed over socket 14, and thus provide both mechanical support and also electrical connection between circuit board 18 and solder balls 13. However, this socketing approach requires a socket thickness of at least the height of solder balls 13 (in their cold, non-reflowed state), and also suffers from the difficulties of high contact force and solder creeping under stress to which cold solder connections are vulnerable, as noted above.

By way of further background, it is known to make removable mechanical connection between integrated circuits having solder balls disposed thereon (e.g., according to the well-known "flip chip" technology) and copper pads having plated palladium dendrites formed thereon. This approach is believed to be used in connection with hybrid, or multi-chip, modules, where replacement of faulty integrated circuit chips is desired. In this example, the solder balls are mechanically forced onto the dendrites, which serve to grip the solder ball and mechanically hold the chip in place, as well as provide electrical connection thereto. Again, the difficulties associated with high contact force and creeping of the solder material are also believed to be present in this approach.

It is therefore an object of the present invention to provide a low cost socketed package and socket system which provides a low profile component placement on the system circuit board.

It is a further object of the present invention to provide such a system which provides low contact force for electrical connection.

It is a further object of the present invention to provide such a system which provides high density placement of terminals of the integrated circuit.

It is a further object of the present invention to provide such a system in which a high thermal conductivity path between the integrated circuit chip and the system circuit board is provided.

Other objects and advantages of the present invention will be apparent to those of ordinary skill in the art having reference to the following specification together with its drawings.

SUMMARY OF THE INVENTION

The invention may be implemented in a "land-grid-array" integrated circuit package and socket system. An integrated circuit chip is mounted upon a thermally conductive slug and is electrically connected to a device circuit board; a transfer-molded plastic encapsulant is located over the chip and bond locations on the device circuit board, for environmental protection. The underside of the device circuit board surrounding the thermally conductive slug has a plurality of plated lands, each connected to the integrated circuit chip therewith. The socket is formed of molded plastic, and has an arrangement of spring elements extending therethrough that are arranged to correspond to the plated lands on the underside of the device circuit board. Surface mounting technology is used to solder the socket to the system circuit board, allowing the land-grid-array package to be inserted and removed from the socket without soldering. A clip is provided to secure the land-grid-array package within the socket. Alternative techniques are utilized for thermal conduction between the thermally conductive slug in the land-grid-array package and the system circuit board.

DETAILED DESCRIPTION OF THE PREFERRED EMBODIMENT

According to the preferred embodiment of the invention, a system is provided that includes a low-profile integrated circuit package and a socket for removably retaining the same. This advantageous system thus allows for the system manufacturer to mount the socket onto the system circuit board, and to thereafter insert the integrated circuit package into the socket. Removal and replacement of the integrated circuit package is thus facilitated by the present invention, while retaining the low-profile form factor of the mounted component and socket system. It is further contemplated that the electrical connection between the integrated circuit package and the system circuit board, through the socket, will be superior in quality and reliability to conventional socketing arrangements used in connection with ball-grid-array (BGA) integrated circuit packages. It is thus contemplated that the present invention will provide the benefits of socket installation, namely in allowing for easy non-destructive removal and replacement of the integrated circuit chip, without incurring the difficulties presented by conventional BGA socketing approaches, while still retaining the benefits of low package cost, low package profile, high thermal conductivity, and high density terminal placement already provided by modern BGA package technology.

Figure 1B:
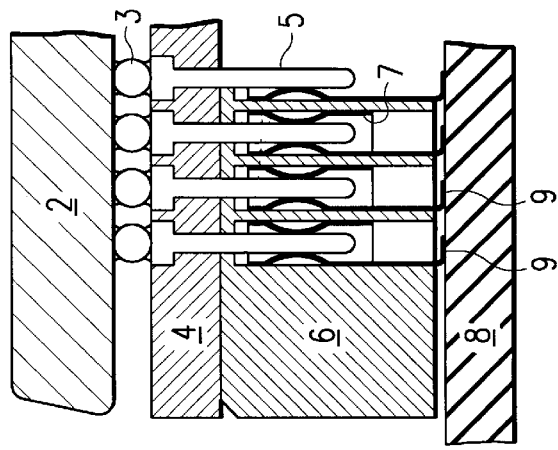
FIGS. 1a and 1b are exploded perspective and partial cross-sectional views, respectively, of a ball-grid-array socketing system according to the prior art.
Figure 2A:
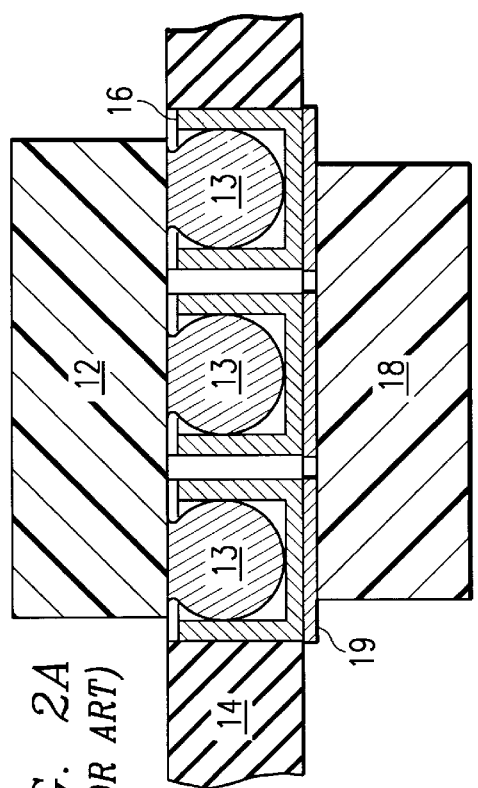
FIGS. 2a and 2b are cross-sectional and partial plan views, respectively, of another ball-grid-array socketing system according to the prior art.
Figure 1A:
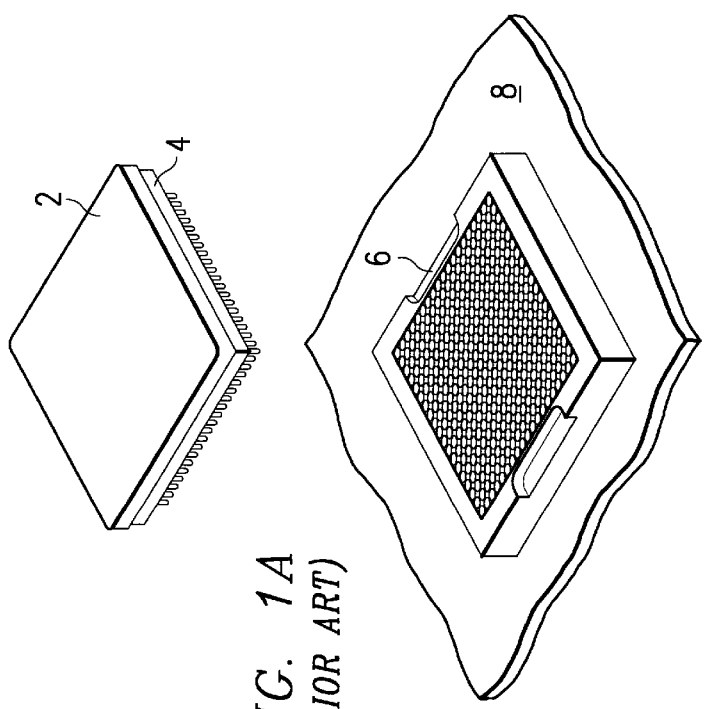
Figure 2B:
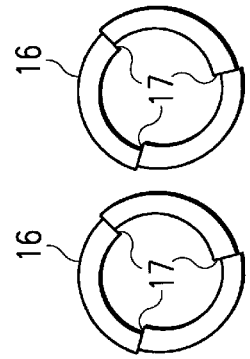
Figure 3A:
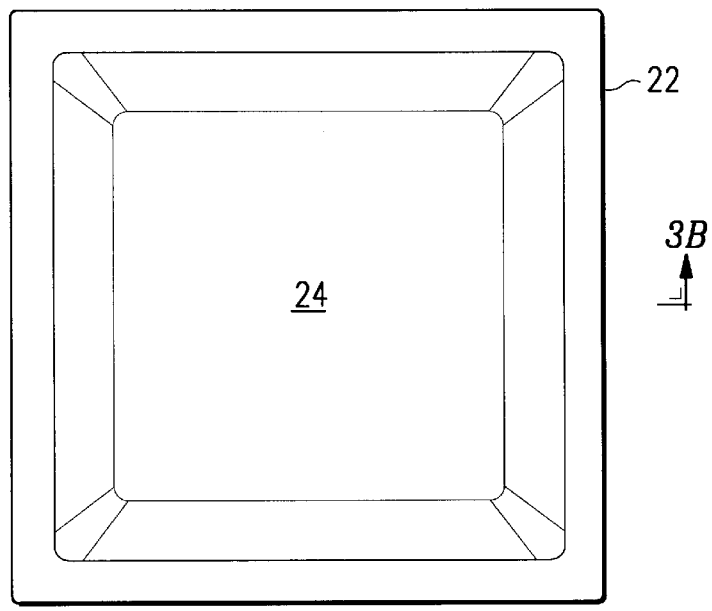
FIGS. 3a, 3b, and 3c are plan, cross-sectional, and underside views of a land-grid-array integrated circuit package used in the preferred embodiment of the invention.
Figure 3B:
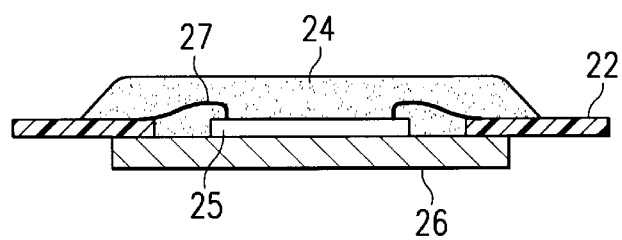
Figure 3C:
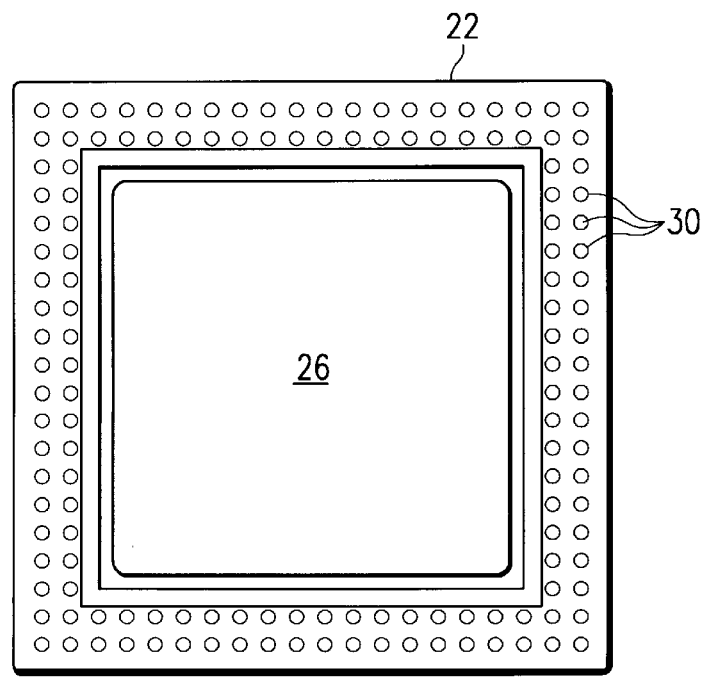

Referring now to FIGS. 3a through 3c, land-grid-array (LGA) integrated circuit package 20 according to the preferred embodiment of the invention will first be described in detail. FIG. 3a provides a topside view of LGA package 20, while FIG. 3b is a cross-sectional view thereof. As shown in FIG. 3b, integrated circuit chip 25 is mounted to thermally conductive slug 26, by way of a thermally conductive adhesive. Conductive slug 26, as will be described hereinbelow, will provide a thermal conduction path between chip 25 and the system circuit board to which the system is mounted, and as such is preferably formed of a highly thermally conductive material such as copper. Conductive slug 26 is attached on its top side not only to integrated circuit chip 25, but also to the underside of device circuit board 22, to provide structural support for chip 25 therewithin.

Device circuit board 22 is preferably formed of conventional printed circuit board material, such as FR-4, and also preferably has a plurality of levels of interconnection therewithin to efficiently carry signals to and from integrated circuit chip 25 without undue noise effects. Alternatively, device circuit board 22 may be a ceramic substrate, or a substrate of another composition as known in the field of integrated circuit packaging. Electrical connection is made between integrated circuit chip 25 and device circuit board 26 by conventional techniques, an example of which is bond wires 27 shown in FIG. 3b, attached by conventional thermocompression wire bond technology.

FIG. 3c is a bottom-side view of LGA package 20. As shown in FIG. 3c, the central portion of which is occupied by conductive slug 26, which extends below the surface of device circuit board 22 (FIG. 3b). An array of plated lands 30 are located on the bottom-side of device circuit board 22, occupying a plurality of rows of connections (e.g., two such rows, as shown in FIG. 3b). Lands 30 are preferably gold-plated lands, to provide for maximum electrical conductivity and minimum required mechanical contact force.

LGA package 20 of FIGS. 3a through 3c thus substantially resembles a conventional ball-grid-array (BGA) package, except that no solder balls are provided on the underside of device circuit board 22 in connection with lands 30. It is also contemplated that the size of lands 30 of LGA package 20 may be slightly larger than the size of corresponding lands for solder balls in conventional BGA packages; for example, the lands of conventional BGA packages are typically on the order of 0.6 mm in diameter, while lands 30 in LGA package 20 may have a diameter of approximately 1.0 mm, for a 1.2 mm pitch package.

Figure 4:
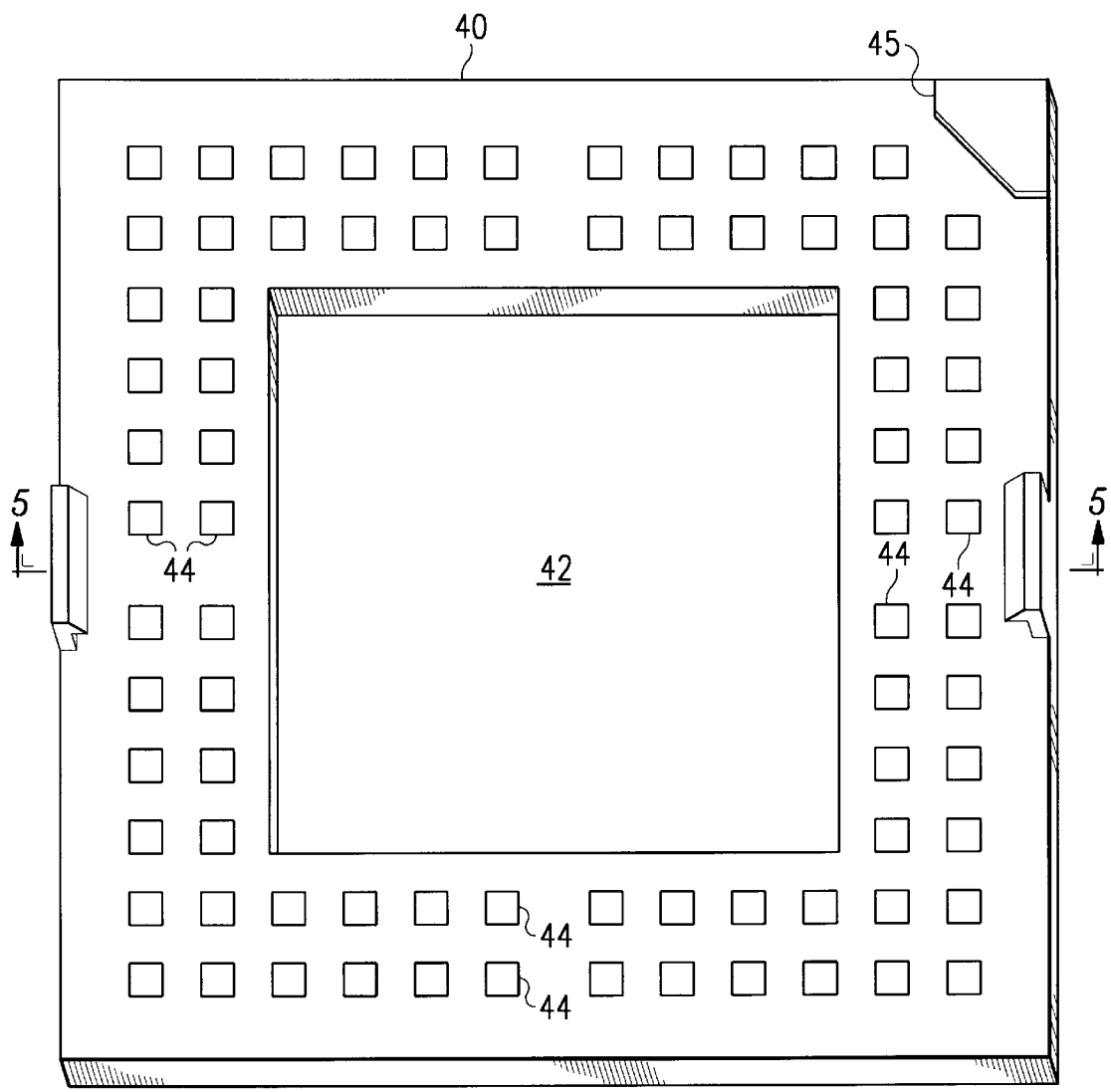
FIGS. 4 and 5 are plan and cross-sectional views, respectively, of the socket used in the preferred embodiment of the invention.
Figure 5:
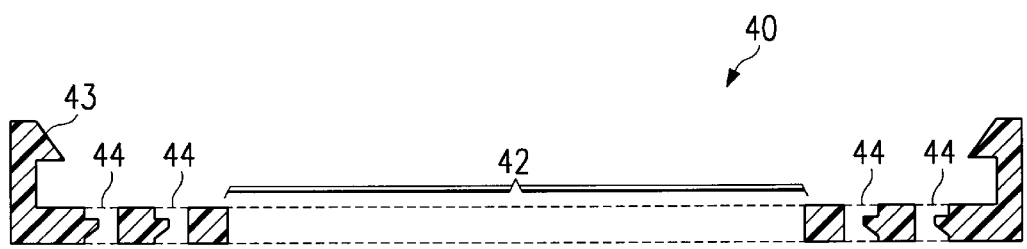

Referring now to FIGS. 4 and 5, the construction of socket 40, with which LGA package 20 mates, will now be described in detail. Socket 40 is preferably fabricated of a low cost material, such as RYTON plastic available from Phillips Petroleum, injected molded to form the shape of LGA package 20. According to this embodiment of the invention, socket 40 is in the shape of a frame with an opening 42 therethrough, through which conductive slug 26 of LGA package 20 can extend to contact a system circuit board, as will be shown hereinbelow. Socket 40 further has orientation indicator 45, which is a cosmetic structure indicating the corner at which a specific terminal of LGA package 20 (e.g., pin 1) is to be placed for proper electrical connection.

Socket 40 further has a plurality of holes 44 therethrough. Holes 44 are matched with the locations of lands 30 on LGA package 20, and will receive spring contact elements that will make contact between the system circuit board and lands 30, as will also be shown hereinbelow.

As shown in FIGS. 4 and 5, socket 40 has snap lips 43, on opposing sides thereof, for snapping around and holding LGA package 20 when inserted into socket 40. Of course, the particular shape and location of snap lips 43 may be selected for the particular application, as useful for ease of removal and installation. Alternatively, socket 40 may be fabricated without snap lips 43, in which case a metal spring clip may be used to secure LGA package within socket 40 after insertion. Examples of conventional spring clips that may be so used, with slight modification, are spring clips of the type commonly used to secure heat sinks to integrated circuit packages.

Figure 6A:
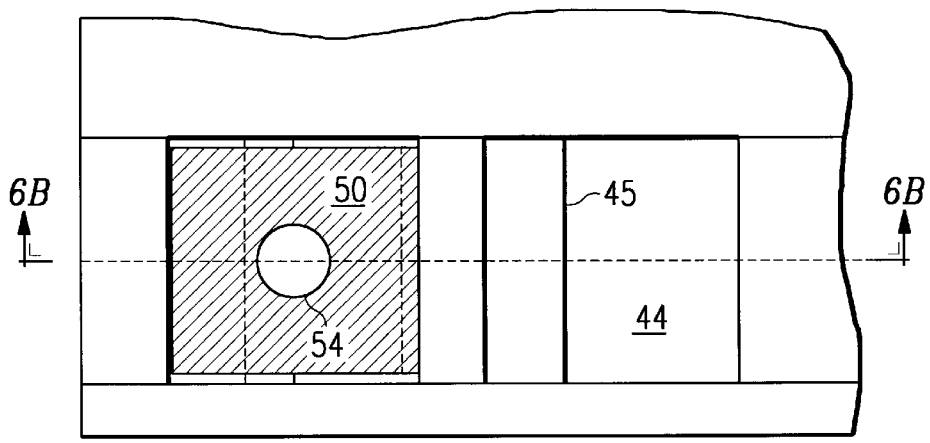
FIGS. 6a and 6b are plan and cross-sectional views, respectively, of holes in the socket of FIGS. 4 and 5, and illustrating the position of spring contact elements therein.
Figure 6B:
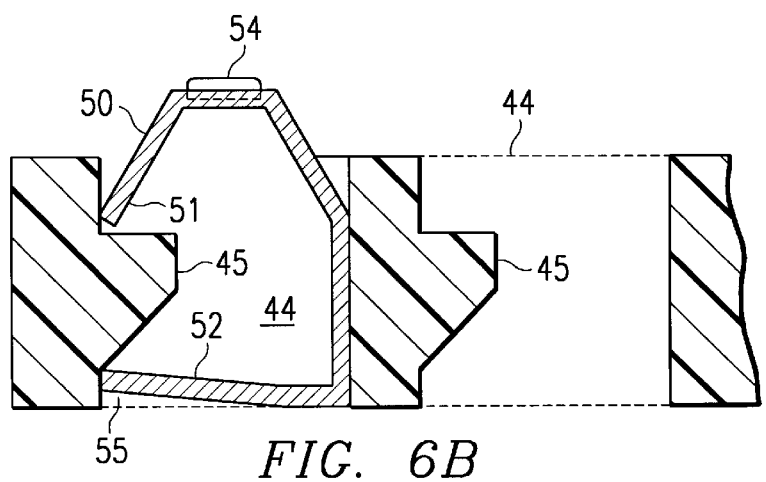

Referring now to FIGS. 6a and 6b, the construction of an example of contact holes 44 and spring contact element 50 according to the preferred embodiment of the invention will now be described in detail. As shown in FIG. 6a, holes 44 are substantially of square shape, to accommodate a spring contact element 50 inserted therethrough. In this embodiment of the invention, as shown more clearly in FIG. 6b, socket 40 includes a molded protrusion 45 extending into each of holes 44. Protrusion 45 has a flat top surface to allow the insertion of spring contact element 50 thereinto from the bottom, and a sloped bottom surface to lock spring contact element 50 thereinto.

Spring contact element 50, in this example, is a strip of precious metal alloy having good spring properties (e.g., PALINEY alloy available from J. M. Ney Co., which is a palladium-silver-copper alloy) formed into the appropriate shape for insertion into and retention by hole 44; the precious metal composition of spring contact elements 50 provide excellent electrical conduction, as is well known. In this example, each spring contact element 50 is formed to have a bent portion with an end 51 that will rest upon the top surface of protrusion 45. An upper surface of spring contact element 50 is formed to have a dimple 54; dimple 54 preferably has a flat top surface so as to make contact to a corresponding one of lands 30 of LGA package 20 over an area (rather than as a point contact). Each spring contact element 50 preferably extends above the upper surface of socket 40, so that it is compressed by LGA package 20 when installed, thus ensuring good electrical contact to its associated land 30. Each spring contact element 50 further has a slightly angled portion 52 at its bottom, which defines, relative to hole 44 in socket 40, a small area 55 into which solder may wick and wet, thus facilitating solder mounting of socket 40 to a system circuit board.

Spring contact elements 50 are preferably formed into the desired shape in their assembly. Spring contact elements 50 are installed into socket 40 merely by inserting each into a corresponding hole 44 from the bottom surface of socket 40, with dimple 54 leading. This technique allows spring contact elements 50 to snap around protrusion 45 and to be held in place thereat. Upon installation of all of spring contact elements 50 into socket 40, socket 40 is then ready for solder mounting to the system circuit board application, as desired.

Figure 9B:
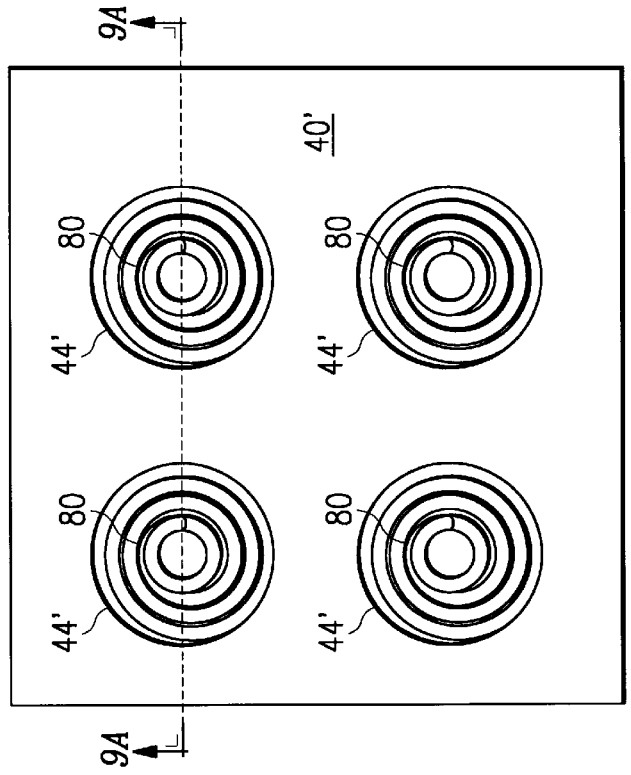
FIGS. 9a and 9b are cross-section and plan views, respectively, of holes in the socket according to an alternative embodiment of the invention, incorporating coil spring contact elements.
Figure 9A:
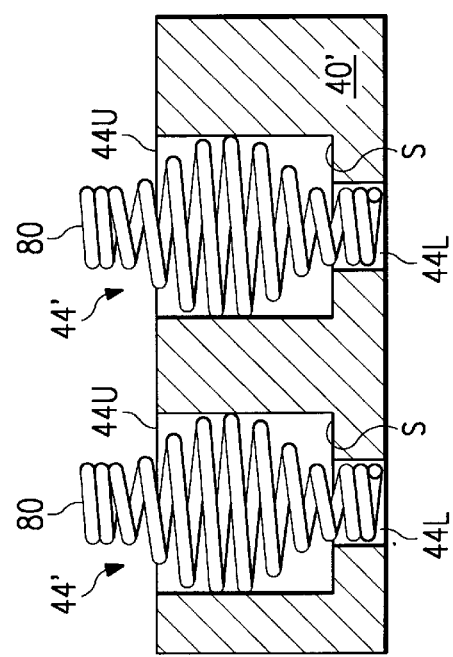

Alternatively, spring contact elements may be formed to have different shapes from that shown in FIGS. 6a and 6b. For example, it is contemplated that coil spring elements may be used to provide contact to LGA package 20 for socket 40. However, such coil spring elements are believed to provide somewhat more inductive contact both to LGA package 20 (on the top side) and to the system circuit board (on the bottom), considering that the surface area of contact will be very small in that event. FIGS. 9a and 9b illustrate such an alternative embodiment of the invention, in which coil spring contact elements 80 are disposed within holes 44' of socket 40'. In this example, holes 44' are of circular cross-section, and preferably have a lower portion 44L of smaller diameter than an upper portion 44U from which coil spring contact elements 80 protrude, resulting in a shoulder S at the change of diameter within holes 44'. Shoulders S provide a stop for coil spring contact elements 80 so as to maintain upward pressure on a chip package 20 inserted thereabove; in addition, shoulders S allow coil spring contact elements 80 to be retained within the combination of chip package 20 and socket 40' in the case where chip package 20 is mounted into socket 40' prior to solder mounting socket 40' to the system circuit board.

Referring back to the embodiment of FIGS. 4, 5, 6a and 6b, socket 40 will typically be wave soldered or subjected to solder reflow depending upon the selected solder composition (i.e., depending upon the type of solder, e.g., a tin lead mixture). Alternatively, LGA package 20 may be mounted into socket 40, prior to the mounting of socket 40 to the system circuit board. For purposes of illustration, FIG. 7 illustrates, in cross-sectional view, the mated combination of LGA package 20 and socket 40 as assembled to system circuit board 33.

Figure 7:
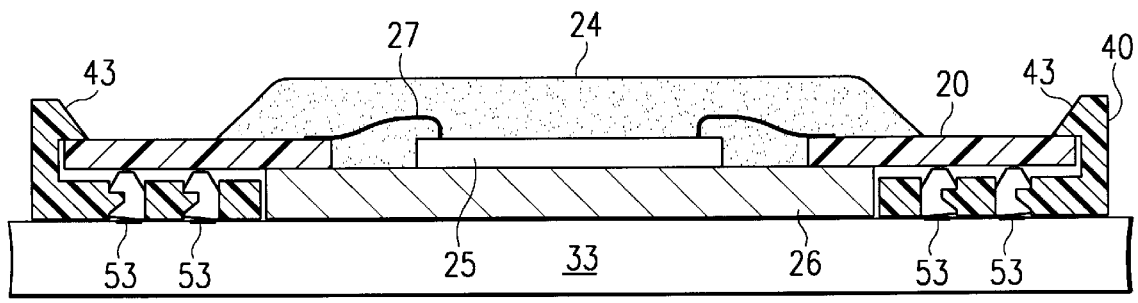
FIG. 7 is a cross-sectional view of the preferred embodiment of the invention, illustrating the land-grid array package inserted into the socket and the socket mounted to a system circuit board.

As shown in FIG. 7, conductive slug 26, upon which chip 25 is mounted in LGA package 20 as described hereinabove, extends through hole 42 in socket 40. The bottom surface of conductive slug 26 is thus exposed for contact with a thermally conductive element (not shown) within system circuit board 33. A thermally conductive "grease" may be applied to the underside of conductive slug 26, to provide a secure thermal path between slug 26 and system circuit board 33, but still allowing removal of LGA package 20 if necessary.

As shown in FIG. 7, snap lips 43 hold LGA package 20 within socket 40. Spring contact elements 50 extend through socket 40, so as to have their dimples 54 in contact with lands 30 in LGA package 20. The lower portion of each of spring contact elements 50 (i.e., portion 52) are wave soldered to system circuit board 33, connected at solder joints 53.

According to this embodiment of the invention, exemplified by the system of LGA package 20 and socket 40, many advantages are obtained. Firstly, a socketed installation of an extremely low profile integrated circuit package is made available, where the socket itself is of low profile. Secondly, the disadvantages of making mechanical connection to solder balls (as is done in conventional socketing arrangements for BGA devices) are avoided, as the solder balls are not present, and because precious metal spring contact elements may now be in direct contact with both a plated land at the underside of the integrated circuit package, and by way of wave solder to the system circuit board. A low resistance contact is thus provided. Furthermore, each of the piece parts used in the construction of the package and socket according to the present invention can be of quite low cost, especially considering the fabrication of LGA package 20 with conventional printed circuit board material and without requiring the attachment of solder balls thereto. The arrangement according to this embodiment of the invention further provides easy installation and removability of LGA package 20 from socket 40; in this example, such versatility is by virtue of snap lips 43 having a sloped corner surface to permit downward force to install LGA package 20 thereinto, along with a flat undersurface that holds LGA package 20 thereat after installation.

Figure 8:
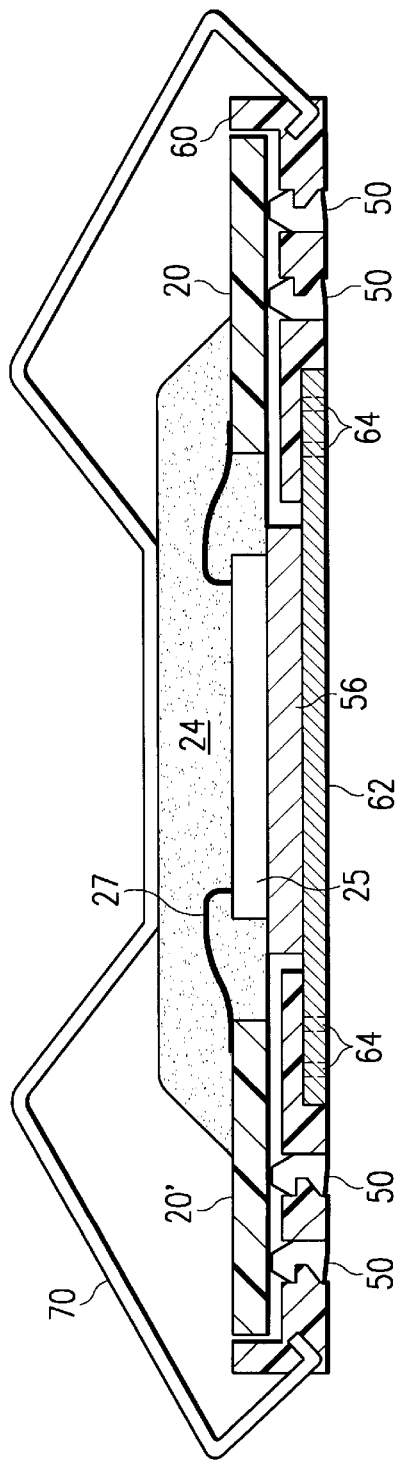
FIG. 8 is a cross-sectional view of an alternative embodiment of the invention, illustrating the land-grid array package inserted into the socket.

Referring now to FIG. 8, an alternative embodiment of the package and socket system according to this embodiment of the invention will now be described in detail. According to this embodiment of the invention, socket 60 is provided with its own thermally conductive slug 62. Slug 62 is attached to the underside of plastic molded body 60 and is exposed in a central opening thereof. Preferably, socket 60 is molded with slug 62, in which case slug 62 preferably has several holes 64 therethrough into which mold compound flows during transfer molding to lock slug 62 to the frame of socket 60.

Also according to this embodiment of the invention, lead-grid array package 20' is similarly constructed as package 20 described hereinabove, having a conductive slug 56 that is similarly positioned as slug 26 in the above-described embodiment, but having only half the thickness. Accordingly, slug 56 becomes in contact with socket slug 62 when LGA package 20' is inserted into socket 60; preferably, a thermal grease is dispensed at the top surface of socket slug 62, to provide good thermal conduction therebetween but yet still provide ease of separability between LGA package 20' and socket 60 if LGA package 20' is to be removed therefrom.

Also in this embodiment of the invention, socket 60 has no snap lips. LGA package 20' is instead retained within socket 60 by way of spring clip 70. Spring clip 70 provides adequate downward pressure on LGA package 20' to ensure that spring contact elements 50 are in contact with their associated lands (not shown), to ensure that conductive slugs 56, 62 are in contact with one another, and to provide mechanical stability. The ends of spring clip 70 are held in holes or depressions within the body of socket 60, as shown in FIG. 8.

This embodiment of the invention provides similar benefits as described hereinabove, but also may allows for increased thermal conductivity from integrated circuit chip 25 to the system circuit board, as socket slug 62 provides additional contact area to the system circuit board from that which may be possible for LGA package 201. Much of the low cost advantages still remain for this embodiment of the invention, as well.

Accordingly, the present invention provides for important advantages in providing low-cost, low-profile socket installation for integrated circuit packages, particularly modern ultra high scale integrated circuits, such as microprocessors, that dissipate several watts of power in operation.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. An integrated circuit package disposed in a socket, comprising:
   an integrated circuit package, comprising:
   a first thermally conductive slug;
   an integrated circuit chip mounted on said first thermally conductive slug;
   a device substrate attached to said first thermally conductive slug, said device substrate having a plurality of plated lands disposed on a bottom surface thereof;
   a plurality of electrical connections between said integrated circuit chip and said device substrate, and
   a socket comprising:
   a frame having a first surface and a second surface, and having an opening therethrough;
   a plurality of spring contact elements disposed proximate to the opening in said frame, each of said spring contact elements extending through said frame from said first surface to said second surface, and each of said spring contact elements being held in contact with a corresponding one of said plated lands; and
   a releasable holding means holding said integrated circuit package proximate to said frame.

2. The integrated circuit package of claim 1 wherein said releasable holding means is formed integrally with said frame.

3. The integrated circuit package of claim 2 wherein said releasable holding means comprises a plurality of snap lips extending from said first surface of said frame.

4. The integrated circuit package of claim 1 wherein said releasable holding means comprises a spring clip.

5. The integrated circuit package of claim 1 wherein each of said spring contact elements is comprised of a precious metal.

6. The integrated circuit package of claim 1 further comprising a plurality of holes formed through said frame, one of said spring contact elements being disposed in each of said holes.

7. The integrated circuit package of claim 6, further comprising a plurality of protrusions, each protrusion being located within one of said holes and being in contact with a respective one of said spring contact elements to hold said spring contact element in said hole.

8. The integrated circuit package of claim 1 wherein each of said spring contact elements further comprises a dimple extending above said first surface of said frame and being in contact with a corresponding one of said plated lands.

9. The integrated circuit package of claim 1, further comprising:
   a second thermally conductive slug disposed within the opening in said frame, said second thermally conductive slug being in contact with said first thermally conductive slug.

10. The integrated circuit package of claim 1, further comprising:
    a layer of thermally conductive grease disposed on a bottom side of said first thermally conductive slug;
    an encapsulant material disposed over said integrated circuit chip; and wherein said device substrate is a device circuit board.

11. The integrated circuit package of claim 1 wherein said spring contact elements are comprised of coil springs.

12. An integrated circuit package disposed in a socket, comprising:
    an integrated circuit package, comprising:
    a thermally conductive slug;
    an integrated circuit chip mounted on said thermally conductive slug;
    a device substrate attached to said thermally conductive slug, said device substrate having a plurality of plated lands disposed on a bottom surface thereof;
    a plurality of electrical connections between said integrated circuit chip and said device substrate; and
    a socket comprising:
       a frame having a first surface and a second surface, and having an opening therethrough;
       a plurality of spring contact elements disposed proximate to the opening in said frame, each of said spring contact elements being held in contact with a corresponding one of said plated lands; and
       a releasable holding means holding said integrated circuit package proximate to said frame.

13. The integrated circuit package of claim 12, further comprising:
    a layer of thermally conductive grease disposed on a bottom side of said thermally conductive slugs;
    an encapsulant material disposed over said integrated circuit chip; and
    wherein said device substrate is a device circuit board.

14. The integrated circuit package of claim 12 wherein said spring contact elements are comprised of coil springs.

15. An integrated circuit package disposed in a socket, comprising:
    a first thermally conductive slug having a first surface and a second surface;
    an integrated circuit chip mounted to the first surface of said first thermally conductive slug;
    a device substrate having a bottom surface, said device substrate being fixed to said first thermally conductive slug, the second surface of said first thermally conductive slug extending below the bottom surface of said device substrate;
    a plurality of electrical connections between said integrated circuit chip and said device substrate;
    a plurality of plated lands disposed on the bottom surface of said device substrate;
    a frame;
    a plurality of spring contact elements disposed in said frame, each of said spring contact elements extending through said frame; and
    a releasable holding means holding said device substrate proximate to said frame, each of said plated lands being in contact with a respective one of said spring contact elements.

16. The integrated circuit package of claim 15, further comprising an opening formed through said frame, said first thermally conductive slug being aligned in the opening of said frame and being received therein.

17. The integrated circuit package of claim 16, further comprising a second thermally conductive slug disposed in the opening of said frame, said second thermally conductive slug being in contact with said first thermally conductive slug.

18. An integrated circuit package mounted on a system substrate, comprising:
    a first thermally conductive slug having a first surface and a second surface;
    an integrated circuit chip mounted to the first surface of said first thermally conductive slug;
    a device substrate having a bottom surface, said device substrate being fixed to said first thermally conductive slug, the second surface of said first thermally conductive slug extending below the bottom surface of said device substrate;
    a plurality of electrical connections between said integrated circuit chip and said device substrate;
    a plurality of plated lands disposed on the bottom surface of said device substrate;
    a frame having a first surface and a second surface, and having a plurality of holes formed therethrough;
    a plurality of spring contact elements, each spring contact element being disposed in one of said holes;
    a plurality of conductive joints formed on a system substrate, each of said conductive joints being connected to a second end of a respective one of said spring contact elements such that said frame is fixed to said system substrate; and
    a releasable holding means holding said device substrate proximate to said frame, each of said plated lands being in contact with a first end of a respective one of said spring contact elements such that a plurality of conductive pathways are formed, each conductive pathway comprising one of said plated lands, one of said spring contact elements, and one of said conductive joints.

19. The integrated circuit package of claim 18, further comprising an opening formed through said frame, said first thermally conductive slug being aligned in the opening of said frame and being received therein.

20. The integrated circuit package of claim 19 wherein said first thermally conductive slug is held in contact with said system substrate, and further comprising a layer of thermally conductive grease being disposed between said first thermally conductive slug and said system substrate.

21. The integrated circuit package of claim 19, further comprising a second thermally conductive slug fixed in the opening in said frame, said second thermally conductive slug being held in contact with said first thermally conductive slug and said system substrate, said second thermally conductive slug being disposed between said first thermally conductive slug and said system substrate.

22. The integrated circuit package of claim 21, further comprising:
   a layer of thermally conductive grease interposed between said first thermally conductive slug and said second thermally conductive slug; and
   a layer of thermally conductive grease interposed between said second thermally conductive slug and said system substrate.

23. The integrated circuit package of claim 19 wherein said conductive joints are solder joints, the second end of each of said spring contact elements being connected to one of said solder joints with a solder connection, and wherein said device substrate is a device circuit board and said system substrate is a system circuit board.

24. The integrated circuit package of claim 19, further comprising an encapsulant material disposed over said integrated circuit chip.

25. The integrated circuit package of claim 19 wherein each of said holes further comprises a protrusion, each of said spring contact elements being held in a respective one of said holes by one of said protrusions.

26. The integrated circuit package of claim 19 wherein said releasable holding means is formed integrally with said frame.

27. The integrated circuit package of claim 26 wherein said releasable holding means comprises a plurality of opposing snap lips.

28. The integrated circuit package of claim 19 wherein said releasable holding means comprises a spring clip.

29. The integrated circuit package of claim 19 wherein the second end of each of said spring contact elements extends through the second surface of said frame and the first end of each of said spring contact elements extends through the first surface of said frame.

30. The integrated circuit package of claim 19 wherein each spring contact element is comprised of a coil spring.

31. The integrated circuit package of claim 19 wherein each of the spring contact elements is comprised of a precious metal and the first end of each of said spring contact elements is formed in the shape of a dimple.

\* \* \* \* \*